(12) United States Patent
Ito et al.

(10) Patent No.: US 8,221,958 B2
(45) Date of Patent: Jul. 17, 2012

(54) PHOTOSENSITIVE PASTE AND SINTERED LAYER

(75) Inventors: Kazushige Ito, Kanagawa (JP); Masakatsu Kuroki, Kanagawa (JP)

(73) Assignee: E.I. du Pont de Nemours and Company, Wilmington, DE (US)

( * ) Notice: Subject to any disclaimer, the term of this patent is extended or adjusted under 35 U.S.C. 154(b) by 201 days.

(21) Appl. No.: 12/473,684

(22) Filed: May 28, 2009

(65) Prior Publication Data

US 2010/0136484 A1    Jun. 3, 2010

Related U.S. Application Data

(60) Provisional application No. 61/057,343, filed on May 30, 2008.

(51) Int. Cl.
*G03F 7/028* (2006.01)
*G03F 7/032* (2006.01)
*G03F 7/20* (2006.01)
*G03F 7/30* (2006.01)
*G03F 7/40* (2006.01)

(52) U.S. Cl. ............ 430/285.1; 430/281.1; 430/270.1; 430/311; 430/325; 430/330

(58) Field of Classification Search .................. None
See application file for complete search history.

(56) References Cited

U.S. PATENT DOCUMENTS

| | | | |
|---|---|---|---|
| 4,533,689 A * | 8/1985 | Tayama et al. | 524/130 |
| 5,972,564 A | 10/1999 | Kawana | |
| 6,132,937 A | 10/2000 | Suzuki | |
| 6,197,480 B1 | 3/2001 | Iguchi et al. | |
| 6,749,994 B2 | 6/2004 | Oshio et al. | |
| 6,790,596 B2 | 9/2004 | Kubota et al. | |
| 2002/0096666 A1 * | 7/2002 | Ichikawa et al. | 252/500 |
| 2005/0011401 A1 * | 1/2005 | Bauer et al. | 106/18.11 |
| 2007/0149635 A1 * | 6/2007 | Mutoh | 522/6 |

FOREIGN PATENT DOCUMENTS

JP     2004-029839 A     1/2004

OTHER PUBLICATIONS

International Search Report for International Application No. PCT/US2009/045590 Dated Sep. 2, 2009.

* cited by examiner

*Primary Examiner* — Sin J. Lee

(57) ABSTRACT

Disclosed is a photosensitive paste including glass frit; organic binder; polymerizable monomer; photopolymerization initiator; and organic solvent, wherein at least a part of the polymerizable monomer contains phosphorus atom within the structure.

14 Claims, 5 Drawing Sheets

PHOTOSENSITIVE PASTE AND SINTERED LAYER

BACKGROUND OF THE INVENTION

1. Field of the Invention

Figure 1:
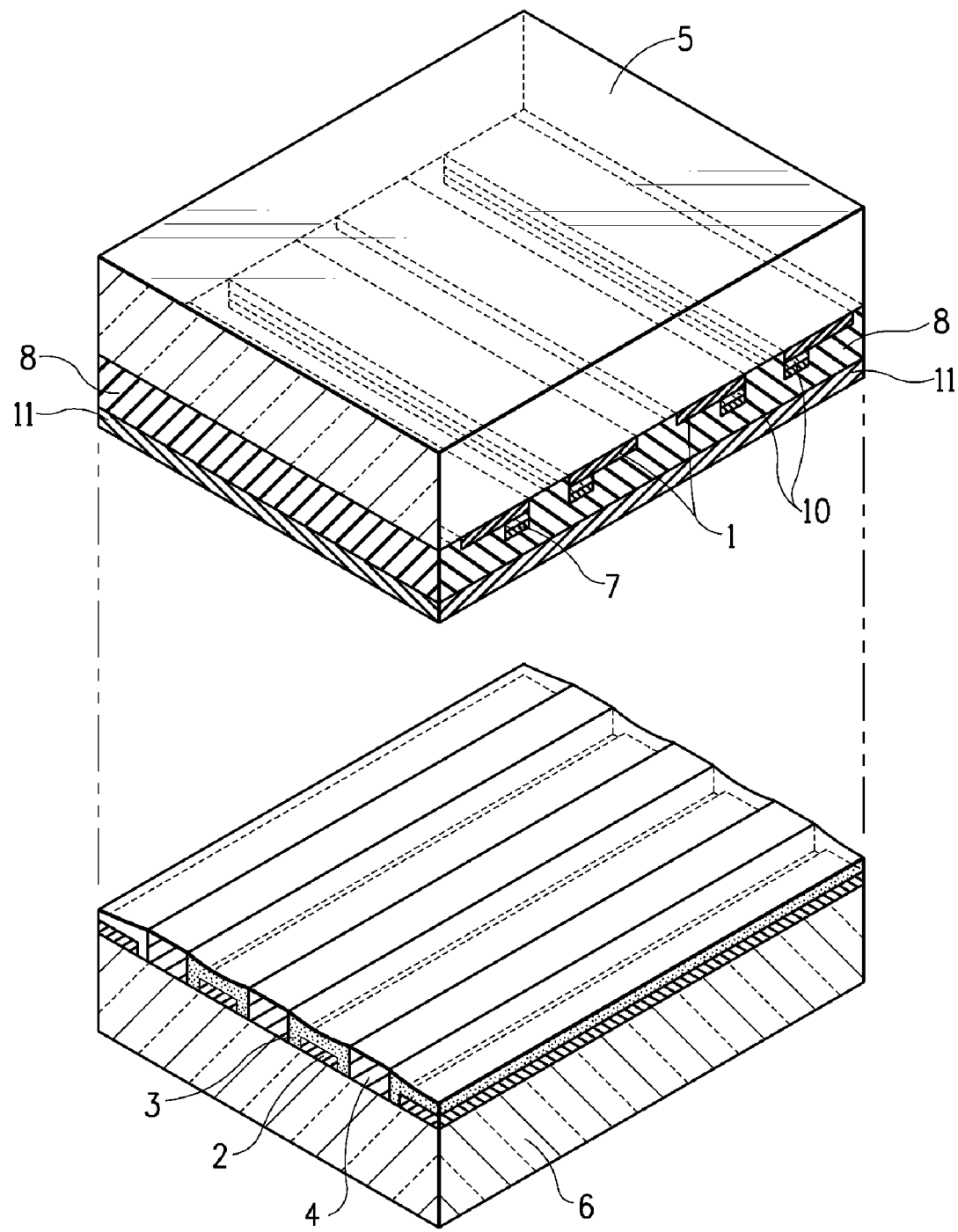

The present invention relates to a photosensitive paste, and more particularly to improvements in the monomer component included in photosensitive paste.

2. Description of Related Art

Paste is widely used to form conductive pattern such as electrode or resistance pattern. Paste includes functional components which impart functions to formed pattern and other components which impart excellent properties to paste itself. For instance, conductive paste for electrode includes conductive powder, glass frit, organic binder, organic solvent, and additives such as stabilizer. Conductive powder imparts conductivity to formed electrode. Glass frit works as binder to keep conductive powder in a sintered electrode. Organic binder works as binder to keep each component dispersed in paste.

With development of electric material, the demand for fine pattern has been increasing. Photosensitive paste was developed to meet this demand. Photosensitive paste includes monomer and photopolymerization initiator as component of paste, the polymerization proceeds in an area where light is irradiated (negative type photosensitive paste). After the following development process, the area remains as pattern. As compared with screen printing, finer pattern can be formed by use of photosensitive paste.

However, undercut has been emerging as a serious problem in pattern forming by photosensitive paste. Undercut means the width of pattern gets narrow at the bottom part during development in a way that the pattern is eroded inwardly. Undercut is commonly seen in a pattern formed from photosensitive paste with inorganic pigments, because irradiated light is strongly absorbed or reflected in paste layer. When the width of pattern is large, effect of undercut is relatively small and negligible. However, when the width of pattern is small, undercut comes to have impact on the property of pattern. For instance, provided that the amount of undercut is 10 micrometer, pattern width of 100 micrometer is reduced to 90 micrometer by development. Under the same premise, pattern width of 30 micrometer is reduced to 20 micrometer. If the pattern is conductive layer, such a huge change of pattern width means less contact area between the conductive pattern and the adjacent substrate, resulting in increase of resistance. In addition, the reduced contact area between the pattern and the substrate caused by undercut induces less adhesiveness, which leads to defect of electric product.

By the way, the front panel of plasma display panel (PDP) typically has bus electrode with two-layer structure, where white electrode and black electrode are layered in order to improve contrast of panel. Typical structure is, from the side of viewer of PDP, front glass/transparent electrode/black electrode/while electrode. If the undercut of black electrode is large in this structure, a part of while electrode can be seen by viewer, resulting in debasement of contrast.

As conventional monomer used in photosensitive paste, ethylenically unsaturated monomer such as hexanediol triacrylate and ethylene glycol diacrylate, is widely used (cf. U.S. Pat. Nos. 6,790,596, 6,749,994, 6,132,937, 6,197,480). There is a need to provide photosensitive paste with less undercut during development.

BRIEF SUMMARY OF THE INVENTION

The present invention prevents undercut by using phosphorus-containing monomer as a monomer of photosensitive paste.

Specifically, an aspect of the present invention is a photosensitive paste, comprising glass fit; organic binder; polymerizable monomer; photopolymerization initiator; and organic solvent, wherein at least a part of the polymerizable monomer contains phosphorus atom within the structure.

Another aspect of the present invention is A method for manufacturing a pattern of electric device, comprising steps of: coating a photosensitive paste, comprising glass fit; organic binder; polymerizable monomer; photopolymerization initiator; and organic solvent, wherein at least a part of the polymerizable monomer contains phosphorus atom within the structure; drying the coated paste; exposing the coated paste to selectively proceed the polymerization; developing the coated paste to form a pattern; and firing the resultant pattern.

BRIEF DESCRIPTION OF THE DRAWING(S)

Figure 2A:
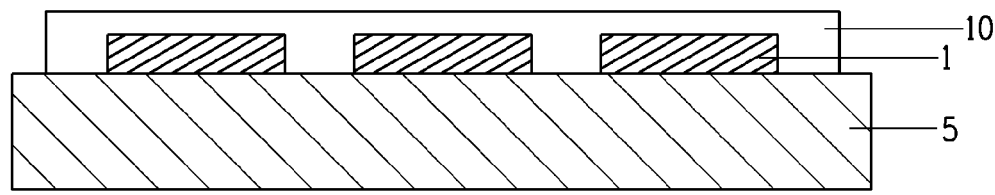
Figure 2B:
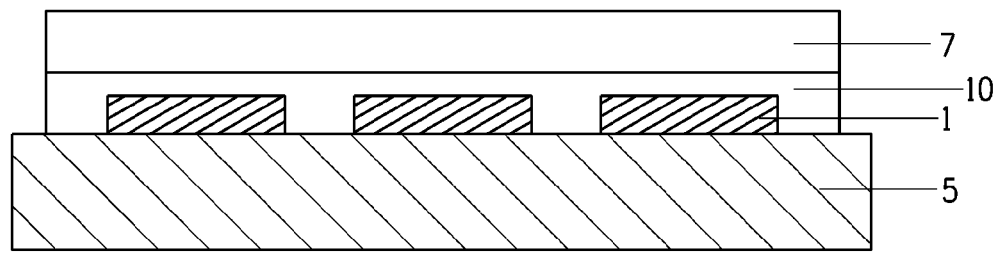
Figure 2C:
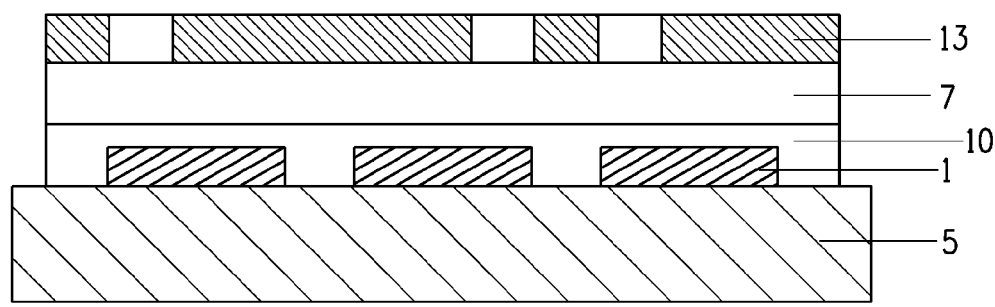
Figure 2D:
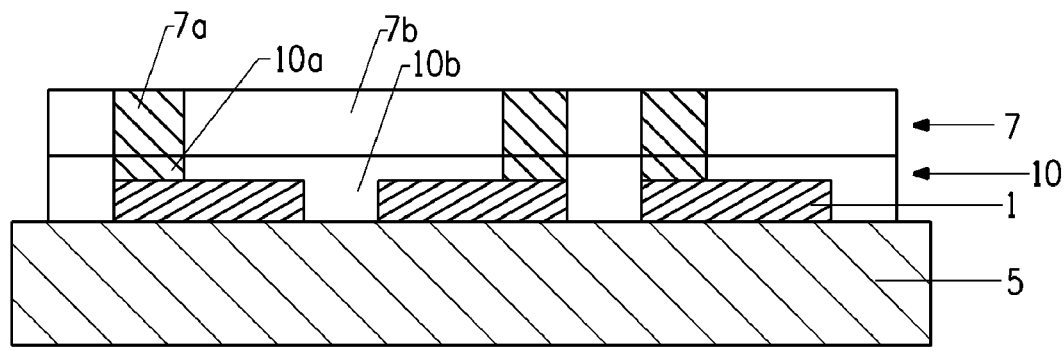
Figure 2E:
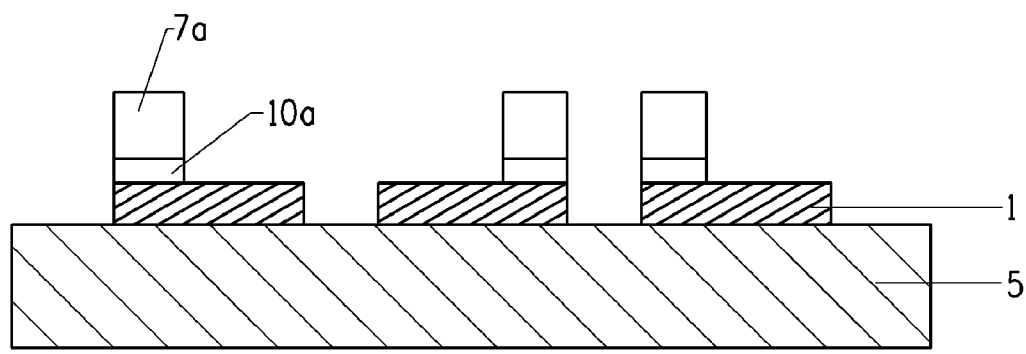
Figure 3:
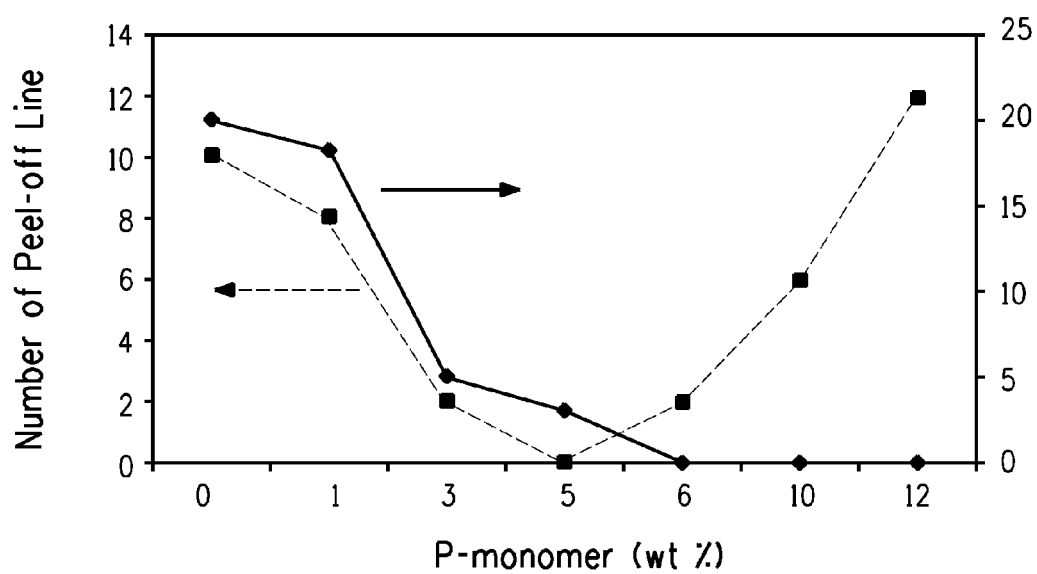

FIG. 1 is a perspective expansion plan schematically illustrating an AC plasma display panel device;

FIG. 2 illustrates a series of processes for producing double-layered bus electrodes on a glass substrate with transparent electrodes, with each figure illustrating (A) the stage where a paste for forming black bus electrodes is applied, (B) the stage where a paste for forming white electrodes is applied, (C) the stage where a given pattern is exposed to light, (D) the development stage, and (E) the sintering stage; and FIG. 3 is a graph showing the relationship between the content of phosphorus monomer and the amount of under cut.

Figure 4:
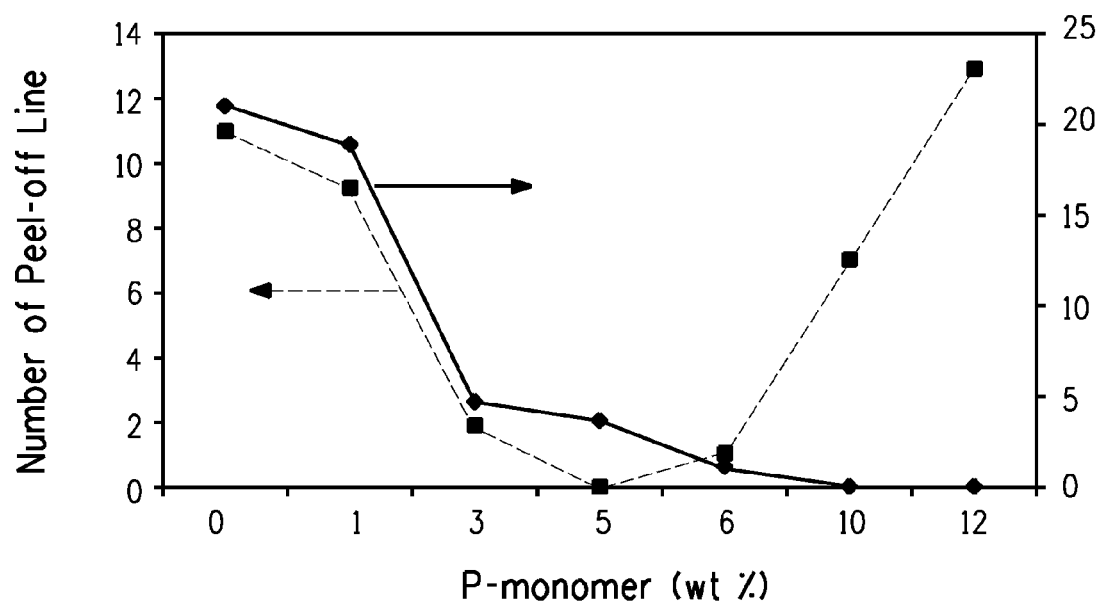

FIG. 4 is a graph showing the relationship between the content of phosphorus-containing monomer and the amount of peel-off defect.

DETAILED DESCRIPTION OF THE INVENTION

The present invention relates to an improved photosensitive paste. The photosensitive paste of the present invention can be conductive or insulating, and can be used for purposes of conducting and insulating. Conductive paste can be used to form a fine electrode pattern, a fine conductive pattern or other such patterning uses. Insulating paste is used to form a fine resistance pattern, a fine insulating pattern, a dielectric pattern etc.

Component of photosensitive paste depends on the applications of paste. Conductive paste for electrode typically includes conductive component such as silver powder as a main component. In contrast, insulating paste typically includes glass frit as a main component. Typical content of components for each application is shown hereinafter.

Preferred content of each component in photosensitive conductive paste is shown below. Photosensitive paste containing each component at the following content can be used for forming an electrode pattern at electric device such as PDP.

The content of the conductive powder is, preferably 50-75 wt %, more preferably 60-75 wt %, based on the total amount of the photosensitive paste. The content of the glass frit is, preferably 0.5-10 wt %, more preferably 0.5-3 wt %, based on the total weight amount of the photosensitive paste. The content of the organic binder is, preferably 5-25 wt %, more preferably 10-15 wt %, based on the total amount of the photosensitive paste. The content of the polymerizable monomer is, preferably 1-15 wt %, more preferably 2-10 wt %, based on the total amount of the photosensitive paste. The content of the photopolymerization initiator is, preferably 1-15 wt %, more preferably 2-8 wt %, based on the total amount of the photosensitive paste. The content of the organic solvent is, preferably 5-15 wt %, more preferably 7-10 wt %, based on the total amount of the photosensitive paste.

Preferred content of each component in paste for PDP black electrode, which is formed for the purpose of better contrast, is shown below.

The content of the black pigment is, preferably 5-20 wt %, more preferably 8-15 wt %, based on the total amount of the photosensitive paste. The content of the glass frit is, preferably 15-40 wt %, more preferably 25-35 wt %, based on the total amount of the photosensitive paste. The content of the organic binder is, preferably 5-20 wt %, more preferably 10-15 wt %, based on the total amount of the photosensitive paste. The content of the polymerizable monomer is, preferably 3-12 wt %, more preferably 5-10 wt %, based on the total amount of the photosensitive paste. The content of the photopolymerization initiator is, preferably 1-15 wt %, more preferably 5-10 wt %, based on the total amount of the photosensitive paste. The content of the organic solvent is, preferably 10-25 wt %, more preferably 15-22 wt %, based on the total amount of the photosensitive paste.

The content of conductive powder in black bus electrode depends on the conductivity of black pigment and purpose. For instance, in case that a black pigment that has conductivity to some degree such as ruthenium oxides or ruthenium pyrochlore is used for forming a black bus electrode of PDP, the content of added conductive powder can be zero. Given the above background, preferred content in paste for black bus electrode is as follows.

The content of the conductive powder is, preferably 0-1.5 wt %, more preferably 0.05-0.5 wt %, based on the total amount of the photosensitive paste.

Preferred content of each component in photosensitive conductive paste is shown below. Photosensitive paste containing each component at the following content can be used for forming an electrode pattern at electric device such as PDP.

The content of the glass frit is, preferably 20-80 wt %, more preferably 40-70 wt %, based on the total amount of the photosensitive paste. The content of the organic binder is, preferably 5-20 wt %, more preferably 7-15 wt %, based on the total amount of the photosensitive paste. The content of the polymerizable monomer is, preferably 3-12 wt %, more preferably 5-10 wt %, based on the total amount of the photosensitive paste. The content of the photopolymerization initiator is, preferably 0.1-10 wt %, more preferably 0.2-5 wt %, based on the total amount of the photosensitive paste. The content of the organic solvent is, preferably 5-20 wt %, more preferably 7-15 wt %, based on the total amount of the photosensitive paste.

The constituents of the conductive composition in the invention will first be described in order. However, the paste includes necessary components among the following components at necessary amount, depending on the usage of paste. The paste of the present invention doesn't necessarily include all of the following components. For instance, conductive powder is not usually included in an insulating paste.

(A) Conductive Powder

Conductive metal powder gives conductivity to a pattern formed from a paste of the present invention. Such conductive metal includes, but is not limited to, gold, silver, platinum, palladium, copper, aluminum, nickel, or an alloy thereof. The alloy includes, but not limited to, Ag—Pd alloy, Ag—Pt alloy, Ag—Pt—Pd alloy, Pt—Pd alloy. In terms of cost and effect, the alloy is preferably Ag—Pd alloy, Ag—Pt—Pd alloy or Pt—Pd alloy, and more preferably Ag—Pd alloy. Core-shell type powder can be used. Examples of the core-shell powder include cupper, nickel, aluminum and tungsten coated with silver or gold. The preferred metal powders are selected from the group consisting of gold, silver, palladium, platinum, copper and combinations thereof. The most preferred metal powder is silver. Silver is commonly available and inexpensive. The sintering temperature for silver is relatively low compared with other metal like gold. Furthermore, it is possible to sinter silver metal under the oxygen-containing atmosphere such as air condition.

Virtually any shape metal powder, including spherical powders and flakes (rods, cones, and plates) may be used in the compositions of the present invention. The preferred shape is a spherical shape because spherical powders have relatively better filling ratio and UV permeability than other shapes.

The conductive powders have an average particle diameter (PSD D50) ranging from 0.1 to 10.0 micrometer. When the average particle diameter (PSD D50) is greater than 10.0 micrometer, the number of defects in the pattern tends to increase. When the average particle diameter (PSD D50) is less than 0.1 micrometer, dispersion and exposure sensitivity of the paste tends to be poor. Here, the mean particle diameter (PSD D50) means the particle diameter corresponding to 50% of the integrated value of the number of particles when the particle size distribution is prepared. The particle size distribution can be determined using a commercially available measuring device such as the X100 by Microtrac.

The conductive powders have a specific surface area ranging from 0.3 to 2 $m^2/g$. Within the above range, rectilinear path of a burned film pattern tends to be excellent and dispersion and exposure sensitivity of the paste also tend to be excellent.

(B) Glass Powder (Glass Frit)

A glass powder works as a binder of components in the formed pattern. The glass powder used in the invention is not particularly limited. Powder with sufficiently low softening point to ensure adhesion with the substrate is normally used.

The softening point of the glass powder is normally to be 325 to 700° C., preferably 350 to 650° C., and more preferably 375 to 600° C. If melting takes place at a temperature lower than 325° C., the organic substances will tend to become enveloped, and subsequent degradation of the organic substances will cause blisters to be produced in the paste. A softening point over 700° C., on the other hand, will weaken the paste adhesion and may damage the glass substrate.

Types of glass powder include bismuth-based glass powder, boric acid-based glass powder, phosphorus-based glass powder, Zn—B based glass powder, and lead-based glass powder. The use of lead-free glass powder is preferred in consideration of the burden imposed on the environment.

Glass powder can be prepared by methods well known in the art. For example, the glass component can be prepared by mixing and melting raw materials such as oxides, hydroxides, carbonates etc, making into a cullet by quenching, followed by mechanical pulverization (wet or dry milling). Thereafter, if needed, classification is carried out to the desired particle size.

The specific surface area of the glass powder is preferred to be no more than 10 $m^2/g$. At least 90 wt % of the glass powder is preferred to have a particle diameter of 0.4 to 10 μm.

(C) Organic Binder

An organic binder is used to allow constituents such as the conductive powder, glass powder, and black pigment to be dispersed in the composition. The organic binder is burned off in sintering process at elevated temperature.

When the composition of the invention is used to produce a photosensitive composition, the development in an aqueous system is preferred to be taken into consideration in selecting the organic binder. One with high resolution is preferred to be selected.

Examples of organic binders include copolymers prepared from (1) non-acidic comonomers containing $C_1$ to $C_{10}$ alkyl acrylates, $C_1$ to $C_{10}$ alkyl methacrylates, styrene, substituted styrene, or combinations thereof, and (2) acidic comonomers containing ethylenic unsaturated carboxylic acid-containing components. When acidic comonomers are present in the paste, the acidic functional groups will permit development in aqueous bases such as 0.8% sodium carbonate aqueous solution. The acidic comonomer content is preferred to be 15 to 30 wt %, based on the polymer weight.

A lower amount of acidic comonomer may complicate the development of the applied paste on account of aqueous bases while too much acidic comonomer may reduce stability of the paste under a development condition, thereby resulting in only partial development in the areas where images are to be formed.

Suitable acidic comonomers include (1) ethylenic unsaturated monocarboxylic acids such as acrylic acid, methacrylic acid, or crotonic acid; (2) ethylenic unsaturated dicarboxylic acids such as fumaric acid, itaconic acid, citraconic acid, vinylsuccinic acid, and maleic acid; (3) hemiesters of (1) and (2); and (4) anhydrides of (1) and (2). Two or more kinds of acidic comonomers may be used concurrently. Methacrylic polymers are more desirable than acrylic polymers in consideration of the combustibility in low-oxygen atmospheres.

When the non-acidic comonomer is an alkyl acrylate or alkyl methacrylate noted above, the non-acidic comonomer is preferred to be 70 to 75 wt %, based on the polymer weight. When the non-acidic comonomer is styrene or substituted styrene, the non-acidic comonomer is preferred to account for about 50 wt %, based on the polymer weight, and the remaining 50 wt % is preferred to be an acid anhydride such as a hemiester of maleic anhydride. α-methylstyrene is a preferred substituted styrene.

The organic binder can be produced using techniques that are well known in the field of polymers. For example, an acidic comonomer can be mixed with one or more copolymerizable non-acidic comonomers in an organic solvent having a relatively low boiling point (75 to 150° C.) to obtain a 10 to 60% monomer mixture. Polymerization is then brought about by adding a polymerization catalyst to the resulting monomer. The resulting mixture is heated to the reflux temperature of the solvent. When the polymer reaction is substantially completed, the resulting polymer solution is cooled to room temperature to recover a sample.

The molecular weight of the organic binder is not particularly limited, but is preferably less than 50,000, more preferably less than 25,000, and even more preferably less than 15,000.

When the conductive composition of the invention is applied by screen printing, the Tg (glass transition temperature) of the organic binder is preferred to be over 40° C. Binders with a Tg below that temperature generally result in a highly adhesive paste when the paste is dried after screen printing. A lower glass transition temperature can be used for materials that are applied by means other than screen printing.

(D) Organic Solvent

The primary purpose for using an organic solvent is to allow the dispersion of solids contained in the composition to be readily applied to the substrate. As such, the organic solvent is preferred to first of all be one that allows the solids to be dispersed while maintaining suitable stability. Secondly, the rheological properties of the organic solvent is preferred to endow the dispersion with favorable application properties.

The organic solvent may be a single component or a mixture of organic solvents. The organic solvent that is selected is preferred to be one in which the polymer and other organic components can be completely dissolved. The organic solvent that is selected is preferred to be inert to the other ingredients in the composition. The organic solvent is preferred to have sufficiently high volatility, and is preferred to be able to evaporate off from the dispersion even when applied at a relatively low temperature in the atmosphere. The solvent is preferred not to be so volatile that the paste on the screen will rapidly dry at ordinary temperature during the printing process.

The boiling point of the organic solvent at ordinary pressure is preferred to be no more than 300° C., and preferably no more than 250° C.

Specific examples of organic solvents include aliphatic alcohols and esters of those alcohols such as acetate esters or propionate esters; terpenes such as turpentine, α- or β-terpineol, or mixtures thereof; ethylene glycol or esters of ethylene glycol such as ethylene glycol monobutyl ether or butyl cellosolve acetate; butyl carbitol or esters of carbitol such as butyl carbitol acetate and carbitol acetate; and Texanol (2,2, 4-trimethyl-1,3-pentanediol monoisobutyrate).

(E) Black Pigment

Black pigment is used to ensure the blackness of the formed pattern. For instance, paste for black layer of PDP bus electrode contains black pigment to increase contrast of display.

The black pigment in the present invention is not particularly limited. Examples include $Co_3O_4$, chromium-copper-cobalt oxides, chromium-copper-manganese oxides, chromium-iron-cobalt oxides, ruthenium oxides, ruthenium pyrochlore, lanthanum oxides (ex. $La_{1-x}Sr_xCoO_3$), manganese cobalt oxides, and vanadium oxides (ex. $V_2O_3$, $V_2O_4$, $V_2O_5$). $Co_3O_4$ (tricobalt tetroxide) is preferred in consideration of the burden imposed on the environment, material costs, the degree of blackness, and the electrical properties of the formed pattern. Two or more types may be used.

(F) Photopolymerization Initiator

Desirable photoinitiators will be thermally inactive but produce free radicals when exposed to actinic rays at a temperature of 185° C. or below. Examples include compounds having two intramolecular rings in a conjugated carbocyclic system. More specific examples of desirable photoinitiators include EDAB (ethyl 4-dimethyl aminobenzoate), DETX (diethylthioxanthone), 2-methyl-[4-(methylthio)-phenyl]-2-morphorino-1-propanone, 9,10-anthraquinone, 2-methyl anthraquinone, 2-ethyl anthraquinone, 2-t-butyl anthraquinone, octamethyl anthraquinone, 1,4-naphthoquinone, 9,10-phenanthrenequinone, benzo[a]anthracene-7, 12-dione, 2,3-naphthacene-5,12-dione, 2-methyl-1,4-naphthoquinone, 1,4-dimethyl anthraquinone, 2,3-dimethyl anthraquinone, 2-phenyl anthraquinone, 2,3-diphenyl anthraquinone, retenquinone, 7,8,9,10-tetrahydronaphthacene-5,12-dione, and 1,2,3,4-tetrahydrobenzo[a]anthracene-7,12-dione.

Other compounds that may be used include those given in U.S. Pat. Nos. 2,850,445, 2,875,047, 3,074,974, 3,097,097, 3,145,104, 3,427,161, 3,479,185, 3,549,367, and 4,162,162.

(G) Photopolymerizable Monomer

The present invention includes a monomer including phosphorus atom within the structure. Such monomer can prevent the amount of undercut during development process. The prevention of undercut brings various benefits to formed pattern. One of them is low power consumption of electric device caused by the reduction of resistance. Another benefit is decreased defect rate relating to chip of pattern.

The phosphorus-containing monomer preferably has the following structure.

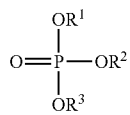

—$R^1$, —$R^2$, —$R^3$ is independently —H, alkyl, aryl or cross-linking group having ethylenically unsaturated double bond, and at least one of —R', —$R^2$ and —$R^3$ has ethylenically unsaturated double bond. More specifically, the cross-linking group is shown by the following formula, —$(R^4)$x-C (=O)—C(—$R^5$)=$CH_2$. —$R^4$ is —$CH_2CH_2O$— or —$C_3H_6O$— wherein x is an integer from 1 to 9, and —$R^5$ is —H or —$CH_3$.

The phosphorus-containing monomer preferably has two or three group that can work as linker during polymerization. In terms of undercut prevention, the phosphorus-containing monomer preferably has three group that can work as linker during polymerization. More specifically, none of $R^1$, $R^2$ and $R^3$ at the above structure formula is not hydrogen, and all of $R^1$, $R^2$ and $R^3$ has ethylenically unsaturated double bond.

The phosphorus-containing monomer includes, but is not limited to, mono-2-(meth)acryloyl oxy ethyl phosphate, di-2-(meth)acryloyl oxy ethyl phosphate, tri-2-(meth)acryloyl oxy ethyl phosphate, mono-2-(meth)acryloyl oxy propyl phosphate, di-2-(meth)acryloyl oxy propyl phosphate, tri-2-(meth)acryloyl oxy propyl phosphate, mono-(meth)acryloyl poly(oxy ethyl) phosphate, di-(meth)acryloyl poly(oxy ethyl) phosphate, tri-2-(meth)acryloyl poly(oxy ethyl) phosphate, mono-(meth)acryloyl poly(oxy) propyl phosphate, di-(meth) acryloyl poly(oxy propyl) phosphate, tri-(meth)acryloyl poly (oxy propyl) phosphate. Two or more phosphorus-containing monomer can be used in combination.

Paste of the present invention can include other polymerizable monomer in addition to phosphorus-containing monomer. For example, ethylenically unsaturated monomer can be included in the paste.

Other polymerizable monomers are not particularly limited. Examples include ethylenic unsaturated compounds having at least one polymerizable ethylene group.

Desirable other monomers that can be used alone or in combination with other monomers include t-butyl (meth) acrylate, 1,5-pentanediole di(meth)acrylate, N,N-dimethylaminoethyl (meth)acrylate, ethylene glycol di(meth)acrylate, 1,4-butanediol di(meth)acrylate, diethylene glycol di(meth)acrylate, hexamethylene glycol di(meth)acrylate, 1,3-propanediol di(meth)acrylate, decamethylene glycol di(meth)acrylate, 1,4-cyclohexanediol di(meth)acrylate, 2,2-dimethylol propane di(meth)acrylate, glycerol di(meth)acrylate, tripropylene glycol di(meth)acrylate, glycerol tri(meth) acrylate, trimethylol propane tri(meth)acrylate, the compounds given in U.S. Pat. No. 3,380,381, the compounds disclosed in U.S. Pat. No. 5,032,490, 2,2-di(p-hydroxyphenyl)-propane di(meth)acrylate, pentaerythritol tetra(meth) acrylate, triethylene glycol diacrylate, polyoxyethyl-1,2-di-(p-hydroxyethyl)propane dimethacrylate, bisphenol A di-[3-(meth)acryloxy-2-hydroxypropyl)ether, bisphenol A di-[2-(meth)acryloxyethyl)ether, 1,4-butanediol di-(3-methacryloxy-2-hydroxypropyl)ether, triethylene glycol dimethacrylate, polyoxypropyl trimethylol propane triacrylate, trimethylol propane ethoxy triacrylate, butylene glycol di(meth)acrylate, 1,2,4-butanediol tri(meth)acrylate, 2,2,4-trimethyl-1,3-pentanediol di(meth)acrylate, 1-phenylethylene-1,2-dimethacrylate, diallyl fumarate, styrene, 1,4-benzenediol dimethacrylate, 1,4-diisopropenyl benzene, 1,3,5-triisopropenyl benzene, monohydroxypolycaprolactone monoacrylate, polyethylene glycol diacrylate, and polyethylene glycol dimethacrylate. Here, "(meth)acrylate" is an abbreviation indicating both acrylate and methacrylate. The above monomers may undergo modification such as polyoxyethylation or ethylation.

Alternatively, an oligomer of the above monomer can be used. "Monomer" is used in this specification to describe polymerizable component. However, in case that such oligomer is used in the paste of the present invention, the description herein regarding the monomer can be applied for the oligomer.

In case the phosphorus-containing monomer and other monomer is used in combination, the content of the phosphorus-containing monomer is preferably more than 1 wt %, more preferably more than 1.5 wt %, still more preferably more than 3 wt %, still more preferably more than 5 wt %, and the most preferably more than 6 wt % based on the total weight of the polymerizable monomer. The more the content of the phosphorus-containing monomer is, the less the amount of the undercut is.

In contrast, when the paste contains too much volume of the phosphorus-containing monomer, formed pattern might be removed from the adjacent substrate, depending on the condition of development. In case that a very harsh condition is adapted for development, it is preferable to adjust the content of the phosphorus-containing monomer. Specifically, the content of the phosphorus-containing monomer is preferably less than 20 wt %, more preferably less than 15 wt %, still more preferably less than 10 wt %, still more preferably less than 8 wt %, and the most preferably less than 8 wt % based on the total weight of the polymerizable monomer.

(H) Additional Components

The paste may also include well-known additional components such as dispersants, stabilizers, plasticizers, stripping agents, defoamers, and wetting agents.

A second aspect of the present invention relates to method for manufacturing a pattern of electric device. The scope of the present invention is not limited to PDP, but the second aspect will be elaborated in more detail with reference to the figures using an AC PDP manufacturing process as an example.

The process for forming a pattern by using photosensitive paste is basically similar regardless of the final product. Namely, the process includes coating of paste, drying, exposure, development and firing. The optimized condition defers from application to application, but the basic procedure is similar and the preferred condition in each application is well known. In the following description, the manufacturing process for PDP bus electrode is used for explanation purpose, however, it is quite obvious to optimize the manufacturing condition depending on the type of paste based on the conventional knowledge.

FIG. 1 illustrates the structure of an AC PDP device with bus electrodes having a two-layer structure. As illustrated in FIG. 1, the front panel of the AC PDP has the following structural elements: glass substrate 5, transparent electrodes 1 formed on the glass substrate 5, black bus electrodes 10 formed on the transparent electrodes 1, and white electrodes 7 formed on the black bus electrodes 10. A dielectric coating layer (transparent overglaze layer) (TOG) 8 and an MgO coating layer 11 are generally formed on the white electrodes 7. The conductive composition of the invention is used to produce the black bus electrodes 10.

The rear panel of the AC PDP has the following structural elements: a dielectric substrate 6, discharge spaces 3 filled with ionized gas, second electrodes (address electrodes) 2 parallel to the transparent electrodes 1, and barrier walls 4 dividing the discharge spaces. The transparent electrodes 1 and second electrodes 2 face each other on either side of the discharge spaces 3.

The black bus electrodes 10 and white electrodes 7 are formed in the following manner. First, a certain pattern is formed through exposure to light. The polymerization reaction will progress in the parts that have been exposed to light, altering the solubility to the developer. The pattern is developed in basic aqueous solution, and the organic parts are then eliminated through sintering at elevated temperature, whereas the inorganic substances are sintered. The black bus electrodes 10 and white electrodes 7 are patterned using the same or very different images. Finally, an electrode assembly comprising sintered, highly conductive black bus electrodes 10 and white electrodes 7 is obtained. The electrode assembly looks black on the surface of the transparent electrodes 1, and the reflection of outside light is suppressed when placed on the front glass substrate. Although illustrated in FIG. 1, the transparent electrodes 1 described below are not necessary when forming the plasma display device of the invention.

A method for producing the bus electrodes on the front panel of the PDP is described in detail below.

As illustrated in FIG. 2, the method for forming the first embodiment of the bus electrode of the invention comprises a series of processes (FIGS. 2A through 2E).

The transparent electrodes 1 are formed on the glass substrate 5 using $SnO_2$ or ITO in accordance with conventional methods known to those having ordinary skill in the art. The transparent electrodes are usually formed with $SnO_2$ or ITO. They can be formed by ion sputtering, ion plating, chemical vapor deposition, or an electrodeposition technique. Such transparent electrode structures and forming methods are well known in the field of AC PDP technology.

The conductive composition for black bus electrodes in the invention is then used to apply an electrode paste layer 10, and the black electrode paste layer 10 is then dried in nitrogen or the air (FIG. 2A).

A photosensitive thick film conductor paste 7 for forming the white electrodes is then applied on the black electrode paste layer 10. The white electrode paste layer 7 is then dried in nitrogen or the air (FIG. 2B).

Paste of the present invention can be used as a paste for white electrode. The white electrode paste can be a well known or commercially available photosensitive thick film conductor paste. Desirable pastes for use in the invention may contain silver particles, glass powder, photoinitiators, monomers, organic binders, and organic solvents. The silver particle configuration may be random or thin flakes, preferably with a particle diameter of 0.3 to 10 μm. The glass powder, photoinitiator, monomer, organic binder, and organic solvent components can be of the same material as those used in the composition for the black bus electrodes. However, the amounts of the components will differ considerably. The amount in which the conductive silver particles are blended in particular will be greater in the white electrode paste, such as about 50 to 90 wt %, based on the total weight of the paste.

The black electrode paste layer 10 and white electrode paste layer 7 are exposed to light under conditions ensuring the formation of the proper electrode patterns after development. During the exposure to light, the material is usually exposed to UV rays through a target 13 or photo tool having a configuration corresponding to the pattern of the black bus electrodes and white electrodes (FIG. 2C).

The parts (10a, 7a) of the black electrode paste layer 10 and white electrode paste layer 7 that have been exposed to light are developed in a basic aqueous solution such as 0.4 wt % sodium carbonate aqueous solution or another alkaline aqueous solution. In this process, the parts (10b, 7b) of the layers 10 and 7 that have not been exposed to light are removed. The parts 10a and 7a that have been exposed to light remain (FIG. 2D). The patterns after development are then formed.

The material that has been formed is sintered at a temperature of 450 to 650° C. (FIG. 2E). At this stage, the glass powder melts and becomes firmly attached to the substrate. The sintering temperature is selected according to the substrate material. In the present invention, a precious metal-containing alloy is used as the conductive component of the black bus electrodes, and sintering can be done at about 600° C. As noted above, the reason is to ensure vertical conduction in PDP black bus electrodes. Sintering at lower temperature is also preferred because sintering at elevated temperatures tends to result in greater Ag diffusion.

The front panel glass substrate assembly produced by the method in FIG. 2 can be used in AC PDP. Returning to FIG. 1, for example, after the transparent electrodes 1, the black bus electrodes 10 and white electrodes 7 have been formed on the front panel glass substrate 5, the front glass substrate assembly is coated with a dielectric layer 8 and then an MgO layer 11. The front panel glass substrate 5 is then combined with a rear panel glass substrate 6.

EXAMPLES

The invention is illustrated in further detail below by examples. The examples are for illustrative purposes only, and are not intended to limit the invention.

(A) Test on the Effect of Phosphorus-Containing

1. Preparation of Organic Components

Texanol (2,2,4-dimethyl-1,3-pentanediol monoisobutyrate) as the organic solvent and an acrylic polymer binder having a molecular weight of 6,000 to 7,000 as the organic binder were mixed, and the mixture was heated to 100° C. while stirred. The mixture was heated and stirred until all of the organic binder had dissolved. The resulting solution was cooled to 75° C. EDAB (ethyl 4-dimethyl aminobenzoate), DETX (diethylthioxanthone), and MMPMP (2-methyl[4-(methylthio)-phenyl]-2-morphorino-1-propanone) by Chiba Specialty Chemicals were added as photopolymerization initiators, and TAOBN (1,4,4-trimethyl-2,3-diazabicyclo[3.2.2]-non-2-ene-N,N-dioxide) was added as a stabilizer. The mixture was stirred at 75° C. until all the solids had dissolved. The solution was filtered through a 40 micron filter and cooled.

2. Preparation of Black Electrode Paste

Phosphorus acid monomer tri-2-acryloyl oxy ethyl phosphate or tri-[acryloyl tri(oxy ethyl)]phosphate and Laromer® LR8967 (epoxy containing acrylate cross linking agent) by BASF, and 0.17 wt % butyrated hydroxytoluene and 0.42 wt % malonic acid as a stabilizer, were mixed with 45 wt % of the above organic component in a mixing tank under yellow light, so as to prepare a paste. 12.67 wt % cobalt oxide ($Co_3O_4$) as the black pigment, conductive powder, and 31.5 wt % glass powder were then added to the organic component mixture. 0.1 wt % Ag—Pd alloy (K8015-15 by Ferro: 85% silver/15% palladium powder) was used as the conductive powder. The type and amount of Phosphorus acid monomer and Laromer® LR8967 was changed as shown in Table 2 and Table 3. The amount (wt %) of phosphor-containing monomer was based on the total amount of added monomers.

The entire paste was mixed until the particles of the inorganic material were wet with the organic material. The mixture was dispersed using a 3-roll mill. The resulting paste was filtered through a 20 μm filter. The viscosity of the paste at this point in time was adjusted with Texanol (organic solvent) to the ideal viscosity for printing.

The amount of components in the paste is shown in Table 1.

TABLE 1

| component | name of compound | amount |
|---|---|---|
| conductive powder | Ag—Pd alloy | 0.1 wt % |
| black pigment | Co$_3$O$_4$ | 12.67 wt % |
| glass powder | Si—Bi | 31.5 wt % |
| organic binder | acrylic polymer (Mw: 6,000-7,000) | 15.00 wt % |
| P-containing polymerizable monomer | Phosphorus acid monomer | 0 wt %-12 wt % |
| other polymerizable monomer | Laromer ® LR8967 | 0.71 wt %-12.71 wt % |
| photopolymerization initiator | EDAB DETX MMPMP | 5.43 wt % |
| organic solvent | Texanol | 22.00 wt % |
| stabilizer | TAOBN BHT malonic acid | 0.59 wt % |

3. Preparation of White Electrode Paste

A photopolymerizable monomer consisting of TMPEOTA (trimethylolpropane ethoxytriacrylate), as well as 0.12 wt % butyrated hydroxytoluene (2,6-di-t-butyl-4-methylphenol, BHT), 0.11 wt % malonic acid, and 0.12 wt % BYK085 by BYK as defoamer, were mixed with 24.19 wt % of the above organic component in a mixing tank under yellow light, so as to prepare a paste. Glass fit and 70 wt % spherical conductive particles of Ag powder were added as the inorganic materials to the mixture of organic components. The entire paste was mixed until the particles of the inorganic material were wet with the organic material. The mixture was dispersed using a 3-roll mill. The resulting paste was filtered through a 30 μm filter.

The viscosity of the paste at this point in time was adjusted with the above Texanol solvent to the ideal viscosity for printing.

4. Preparation of Electrodes

Precautions were taken to avoid dirt contamination, as contamination by dirt during the preparation of the paste and the manufacture of the parts would have resulted in defects.

4-1: Formation of Black Bus Electrodes

The black electrode paste was applied to a glass substrate by screen printing using a 200 to 400 mesh screen. Suitable screen and viscosity of the black electrode paste was selected, to ensure the desired film thickness was obtained. The paste was applied on a glass substrate on which transparent electrodes (thin film ITO) had been formed. The paste was then dried for 20 minutes at 100° C. in a hot air circulating furnace, so as to form black bus electrodes having a dried film thickness of 4.5 to 5.0 μm.

4-2: Formation of White Electrodes

The white electrode paste was applied by screen printing using a 400 mesh screen so as to cover the black electrodes. This was again dried for 20 minutes at 100° C. The thickness of the dried double-layered structure was 12.5 to 15 μm.

4-3: UV Ray Pattern Exposure

The double-layered structure was exposed to light through a photo tool using a collimated UV radiation source (illumination: 18 to 20 mW/cm$^2$; exposure: 200 mj/cm$^2$).

4-4: Development

An exposed sample was placed on a conveyor and then placed in a spray developing device filled with 0.4 wt % sodium carbonate aqueous solution as the developer. The developer was kept at a temperature of 30° C., and was sprayed at 10 to 20 psi. The sample was developed for 12 seconds. The developed sample was dried by blowing off the excess water with an air jet.

4-5: Sintering

A peak temperature of 590° C. was reached (first sintering) by sintering in a belt furnace in air using a 1.5 hour profile.

4-6: TOG Coating

TOG paste was then screen printed using a 150 stainless steel mesh screen. This was again dried for 20 minutes at 100° C. Sintering (second sintering) was done at a peak temperature of 580° C. in a belt furnace in air using a 2.0 hour profile.

5. Evaluation 5-1: Under Cut

After the development, the under cut was determined by the using BX51 by Olympus. The wider under cut, the worse performance photosensitive paste. Especially, the wider undercut, the more defect. As shown in Tables 2 and 3 and FIGS. 3 and 4, very less under cut could be achieved by using phosphorus acid monomer. Phosphorus acid monomer afforded excellent the under cut, and resulted in satisfactory adhesion performance.

5-2: Adhesion performance

After the development, the degree of adhesion between the glass substrate and black electrode was determined. To determine the degree of the adhesion between substrate and black electrode were determined counting peel off line number by the using BX51 by Olympus. A harsh condition than practical condition was used to evaluate the adhesion performance.

The more peel off line number, the worse the adhesion performance. As shown in Tables 2 and 3 and FIGS. 3 and 4, very less peel off line could be achieved by using phosphorus acid monomer. Phosphorus acid monomer afforded excellent the adhesion between the glass substrate and black electrode, and resulted in satisfactory adhesion performance. Judging from the experiment, form 1.0 wt % to 10 wt % is improved region. Especially, there is no peel off line in 5 wt %.

TABLE 2

| | Com. EX. 1 | EX. 2 | EX. 3 | EX. 4 | EX. 5 | EX. 6 | EX. 7 |
|---|---|---|---|---|---|---|---|
| Phosphorus-containing polymerizable monomer | tri-2-acryloyl oxy ethyl phospate | tri-2-acryloyl oxy ethyl phospate | tri-2-acryloyl oxy ethyl phospate | tri-2-acryloyl oxy ethyl phospate | tri-2-acryloyl oxy ethyl phospate | tri-2-acryloyl oxy ethyl phospate | tri-2-acryloyl oxy ethyl phospate |
| amount of P-containing polymerizable monomer (wt %) | 0 | 1 | 3 | 5 | 6 | 10 | 12 |
| number of peel | 10 | 8 | 2 | 0 | 2 | 6 | 12 |

TABLE 2-continued

|  | Com. EX. 1 | EX. 2 | EX. 3 | EX. 4 | EX. 5 | EX. 6 | EX. 7 |
|---|---|---|---|---|---|---|---|
| off line under cut (micrometer) | 20 | 18 | 5 | 3 | 0 | 0 | 0 |

TABLE 3

|  | Com. EX. 8 | EX. 9 | EX. 10 | EX. 11 | EX. 12 | EX. 13 | EX. 14 |
|---|---|---|---|---|---|---|---|
| Phosphorus-containing polymerizable monomer | tri-acryloyl tri(oxy ethyl) phospate | tri-acryloyl tri(oxy ethyl) phospate | tri-acryloyl tri(oxy ethyl) phospate | tri-acryloyl tri(oxy ethyl) phospate | tri-acryloyl tri(oxy ethyl) phospate | tri-acryloyl tri(oxy ethyl) phospate | tri-acryloyl tri(oxy ethyl) phospate |
| amount of P-containing polymerizable monomer (wt %) | 0 | 1 | 3 | 5 | 6 | 10 | 12 |
| number of peel off line | 11 | 9 | 2 | 0 | 1 | 7 | 13 |
| under cut (micrometer) | 21 | 19 | 5 | 4 | 1 | 0 | 0 |

What is claimed is:

1. A photosensitive paste, comprising glass frit; organic binder; polymerizable monomer; photopolymerization initiator; and organic solvent, wherein at least a part of the polymerizable monomer has the following structure:

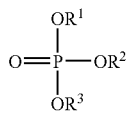

wherein —$R^1$, —$R^2$ and —$R^3$ are cross-linking group having ethylenically unsaturated double bond, wherein the photosensitive paste further comprises conductive powder, and wherein the content of the conductive powder is 50-75 wt %, the content of the glass frit is 0.5-10 wt %, the content of the organic binder is 5-25 wt %, the content of the polymerizable monomer is 1-15 wt %, the content of the photopolymerization initiator is 3-15 wt %, and the content of the organic solvent is 5-15 wt %, based on the total weight amount of the photosensitive paste.

2. A photosensitive paste according to claim 1, wherein the polymerizable monomer is selected from the group consisting of tri-2-(meth) acryloyl oxy ethyl phospate, tri-2-(meth) acryloyl oxy propyl phospate, tri-2-(meth) acryloyl poly(oxy ethyl) phospate, and tri-(meth)acryloyl poly(oxy propyl) phospate.

3. A photosensitive paste according to claim 1, wherein the polymerizable monomer with the above structure is 1-10 wt % based on the total weight of the polymerizable monomer.

4. A photosensitive paste, comprising glass frit; organic binder; polymerizable monomer; photopolymerization initiator; and organic solvent, wherein at least a part of the polymerizable monomer has the following structure:

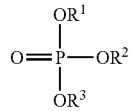

wherein —$R^1$, —$R^2$ and 13 $R^3$ are cross-linking group having ethylenically unsaturated double bond, wherein the photosensitive paste further comprises black pigment, and optionally conductive powder, and wherein the content of the conductive powder is 0-1.5 wt %, the content of the black pigment is 5-20 wt %, the content of the glass frit is 15-40 wt %, the content of the organic binder is 5-20 wt %, the content of the polymerizable monomer is 3 -12 wt %, the content of the photopolymerization initiator is 5 -15 wt %, and the content of the organic solvent is 10-25 wt %, based on the total amount of the photosensitive paste.

5. A photosensitive paste according to claim 4, wherein the polymerizable monomer is selected from the group consisting of tri-2-(meth)acryloyl oxy ethyl phospate, tri-2-(meth) acryloyl oxy propyl phospate, tri-2-(meth)acryloyl poly(oxy ethyl) phospate, and tri-(meth)acryloyl poly(oxy propyl) phospate.

6. A photosensitive paste according to claim 4, wherein the polymerizable monomer with the above structure is 1-10 wt % based on the total weight of the polymerizable monomer.

7. A photosensitive paste, comprising glass frit; organic binder; polymerizable monomer; photopolymerization initiator; and organic solvent, wherein at least a part of the polymerizable monomer has the following structure:

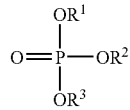

wherein —R$^1$, —R$^2$ and —R$^3$ are cross-linking group having ethylenically unsaturated double bond,
wherein the photosensitive paste is an insulating paste, and wherein the content of the glass frit is 20-80 wt %, the content of the organic binder is 5-20 wt %, the content of the polymerizable monomer is 3-12 wt %, the content of the photopolymerization initiator is 0.1-10 wt %, and the content of the organic solvent is 5-20 wt %, based on the total amount of the photosensitive paste.

8. A photosensitive paste according to claim 7, wherein the polymerizable monomer is selected from the group consisting of tri-2-(meth)acryloyl oxy ethyl phospate, tri-2-(meth)acryloyl oxy propyl phospate, tri-2-(meth)acryloyl poly(oxy ethyl) phospate, and tri-(meth)acryloyl poly(oxy propyl) phospate.

9. A photosensitive paste according to claim 7, wherein the polymerizable monomer with the above structure is 1-10 wt % based on the total weight of the polymerizable monomer.

10. A method for manufacturing a pattern of electric device, comprising steps of:
   coating a photosensitive paste, comprising glass frit; organic binder; polymerizable monomer; photopolymerization initiator; organic solvent, wherein at least a part of the polymerizable monomer has the following structure:

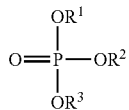

wherein —R$^1$, —R$^2$ and —R$^3$ are cross-linking group having ethylenically unsaturated double bond; wherein the photosensitive paste further comprises conductive powder, and wherein the content of the conductive powder is 50-75 wt %, the content of the glass frit is 0.5-10 wt %, the content of the organic binder is 5-25 wt %, the content of the polymerizable monomer is 1-15 wt %, the content of the photopolymerization initiator is 3-15 wt %, and the content of the organic solvent is 5-15 wt %, based on the total weight amount of the photosensitive paste;
   drying the coated paste;
   exposing the coated paste to selectively proceed the polymerization;
   developing the coated paste to form a pattern; and
   firing the resultant pattern.

11. A method for manufacturing a pattern of electric device according to claim 10, wherein the polymerizable monomer is selected from the group consisting of tri-2-(meth)acryloyl oxy ethyl phospate, tri-2-(meth)acryloyl oxy propyl phospate, tri-2-(meth)acryloyl poly(oxy ethyl) phospate, and tri-(meth)acryloyl poly(oxy propyl) phospate.

12. A method for manufacturing a pattern of electric device according to claim 10, wherein the polymerizable monomer with the above structure is 1-10 wt % based on the total weight of the polymerizable monomer.

13. A method for manufacturing a pattern of electric device, comprising steps of:
   coating a photosensitive paste, comprising glass frit; organic binder; polymerizable monomer; photopolymerization initiator; and organic solvent, wherein at least a part of the polymerizable monomer has the following structure:

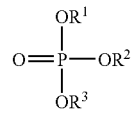

wherein —R$^1$, —R$^2$ and —R$^3$ are cross-linking group having ethylenically unsaturated double bond, wherein the photosensitive paste further comprises black pigment, and optionally conductive powder, and wherein the content of the conductive powder is 0-1.5 wt %, the content of the black pigment is 5-20 wt %, the content of the glass frit is 15-40 wt %, the content of the organic binder is 5-20 wt %, the content of the polymerizable monomer is 3-12 wt %, the content of the photopolymerization initiator is 5-15 wt %, and the content of the organic solvent is 10-25 wt %, based on the total amount of the photosensitive paste;
   drying the coated paste;
   exposing the coated paste to selectively proceed the polymerization;
   developing the coated paste to form a pattern; and
   firing the resultant pattern.

14. A method for manufacturing a pattern of electric device, comprising steps of:
   coating a photosensitive paste, comprising glass frit; organic binder;
   polymerizable monomer; photopolymerization initiator; and organic solvent, wherein at least a part of the polymerizable monomer has the following structure:

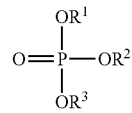

wherein —R$^1$, —R$^2$ and —R$^3$ are cross-linking group having ethylenically unsaturated double bond, wherein the photosensitive paste is an insulating paste, and wherein the content of the glass frit is 20-80 wt %, the content of the organic binder is 5-20 wt %, the content of the polymerizable monomer is 3-12 wt %, the content of the photopolymerization initiator is 0.1-10 wt %, and the content of the organic solvent is 5-20 wt %, based on the total amount of the photosensitive paste;
   drying the coated paste;
   exposing the coated paste to selectively proceed the polymerization;
   developing the coated paste to form a pattern; and
   firing the resultant pattern.

\* \* \* \* \*

UNITED STATES PATENT AND TRADEMARK OFFICE
CERTIFICATE OF CORRECTION

PATENT NO. : 8,221,958 B2
APPLICATION NO. : 12/473684
DATED : July 17, 2012
INVENTOR(S) : Kazushige Ito and Masakatsu Kuroki Page 1 of 1

It is certified that error appears in the above-identified patent and that said Letters Patent is hereby corrected as shown below:

In the Claims:

In Claim 4, line 6, please remove the number "13".

Signed and Sealed this
Thirteenth Day of August, 2013

Teresa Stanek Rea
*Acting Director of the United States Patent and Trademark Office*

UNITED STATES PATENT AND TRADEMARK OFFICE
CERTIFICATE OF CORRECTION

PATENT NO. : 8,221,958 B2  
APPLICATION NO. : 12/473684  
DATED : July 17, 2012  
INVENTOR(S) : Kazushige Ito and Masakatsu Kuroki Page 1 of 1

It is certified that error appears in the above-identified patent and that said Letters Patent is hereby corrected as shown below:

In the Claims:

Column 14, line 34 (Claim 4, line 6) please remove the number "13".

This certificate supersedes the Certificate of Correction issued August 13, 2013.

Signed and Sealed this  
Third Day of September, 2013

Teresa Stanek Rea  
*Acting Director of the United States Patent and Trademark Office*